(12) United States Patent
Haskin

(10) Patent No.: US 6,999,739 B2
(45) Date of Patent: Feb. 14, 2006

(54) STACKED FET RECEIVER METHOD AND APPARATUS

(75) Inventor: Bryan Haskin, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 467 days.

(21) Appl. No.: 10/310,419

(22) Filed: Dec. 5, 2002

(65) Prior Publication Data

US 2004/0110480 A1 Jun. 10, 2004

(51) Int. Cl.
*H04Q 11/12* (2006.01)
*H04B 1/04* (2006.01)
*H04B 1/16* (2006.01)

(52) U.S. Cl. ............... 455/127.1; 455/343.1; 455/117; 455/217

(58) Field of Classification Search ............ 455/127.1, 455/343.1, 117, 217; 327/100, 101–104, 327/306, 309; 361/736, 748

See application file for complete search history.

(56) References Cited

U.S. PATENT DOCUMENTS

| | | | | |
|---|---|---|---|---|
| 5,642,072 A | * | 6/1997 | Miyamoto et al. | 327/535 |
| 5,703,500 A | * | 12/1997 | Vo | 326/71 |
| 6,414,521 B1 | * | 7/2002 | Potter et al. | 327/67 |

* cited by examiner

*Primary Examiner*—Nguyen T. Vo

(57) ABSTRACT

A receiver method and apparatus is presented. Signals are received from a high-voltage environment to a low-voltage environment using low-voltage devices, such as low-voltage FETs. A reference stage (i.e., first stage) provides the reference point for an input signal that is received into a second stage. The reference stage works in conjunction with the second stage to control the output of the second stage. The reference stage and the second stage communicate through floating voltage signals. The output of the second stage is an inverted signal that floats. A third stage receives the inverted signals and corrects the signal to a baseline (i.e., adds gain to the signal). The signal is then clipped by a clipping stage (i.e., fourth stage). The clipping stage clips the high-voltage signal so that it will operate with the devices in the low-voltage environment. A fifth stage is then biased with a low voltage and the clipped signal is shifted downwards. Lastly, an inverter (i.e., sixth stage) receives the signal that has been shifted downward and outputs the signal to an output node.

10 Claims, 4 Drawing Sheets

STACKED FET RECEIVER METHOD AND APPARATUS

BACKGROUND OF THE INVENTION

1. Field of the Invention

This invention relates to electronics systems. Specifically, the present invention relates to electronic circuits.

2. Description of the Related Art

Large-scale electronic systems include a variety of sub-systems. The sub-systems may include a number of electrical boards or may include a number of components on a single board. For example, a number of chips may reside on a single board.

When several chips reside in a large-scale electronic system or sub-system, there is a need to integrate the chips with the large-scale electronic system. However, integrated circuits located in the chip may operate under different constraints than the other components in the large-scale electronic system. For the purpose of discussion, the integrated circuit in the chip is defined as an internal environment and the area of the large-scale electronic system outside of the chip is defined as an external environment. Quite often the constraints of the internal environment are different than the constraints of the external environment. For example, the internal environment may operate at a different voltage than the external environment. However, both environments may need to exchange signals and interface with each other.

Conventional electronic systems address this problem by implementing interface circuits known as pads. The pads shift the voltage level between the internal and external environment. The pads may shift the voltage level upward or the pads may shift the voltage level downward. For example, if the external environment is at a high-voltage level and the internal environment is at a low-voltage level, a pad that receives signals from the external environment will shift the voltage level of the signals downward, so that the signal will interface with the internal environment.

Conventional electronic systems implement high-voltage devices, such as transistors (i.e., Field Effect Transistors (FET(s)), to operate in the high-voltage environment. However, in conventional systems, the internal environment may be implemented with low-voltage devices. Since low-voltage devices, such as low-voltage transistors, are not designed to operate in the high-voltage environment, the low-voltage devices fail or malfunction and experience breakdown when exposed to the high-voltage environment. For example, FIG. 1 displays a conventional embodiment of a receiver 100 that shifts a voltage downward. In FIG. 1, an input signal Vin 126 is input into a first inverting pair, which consists of an nFET (i.e., n-type Field Effect Transistor) 124 and a pFET (i.e., p-type Field Effect Transistor) 128. The first inverting pair drives a second inverting pair, which includes a pFET 134 and an nFET 136. The pFET 134 and the nFET 136 are connected between ground 118 and a supply voltage 140 of 1.2 volts. The second inverting pair drives an inverter 142, which includes 1.2-volt FETs. The inverter 142 drives a node shown as 144.

The first inverting pair produces a bias-voltage output. A high_bias voltage is shown as 120 and a low_bias voltage is shown as 125. A reference signal Vref 102, the high_bias voltage 120 and the low_bias voltage 125 provide input to a reference stage. The reference stage consists of four FETs. The four FETs include nFET 104, nFET 106, pFET 108 and pFET 110. The reference stage is connected between ground 118 and a supply voltage 112. Node 109 is defined between pFET 108 and pFET 110. Node 105 is defined between nFET 104 and nFET 106.

During operation, the input signal Vin 126 is applied to the first inverting pair, which consists of nFET 124 and pFET 128. Both nFET 124 and pFET 128 are 2.5-volt FETs. A Vint signal 132 is produced as an output of the first inverting pair. The Vint signal 132 is 2.5 volts when input signal Vin 126 is input at 2.5 volts. The second inverting pair consists of nFET 136 and pFET 134, which are positioned between ground 118 and a 1.2-volt supply voltage 140. A Vshift signal 138 is generated as an output of the second inverting pair. The Vshift signal 138 is 1.2 volts. The Vshift signal 138 is inverted by the inverter 142, which is implemented with 1.2-volt FETs. The inverter 142 produces an output at node 144.

The reference stage consists of a transistor array (e.g., nFET 104, nFET 106, pFET 108 and pFET 110). The reference stage includes a reference signal Vref 102 that provides a trip point for the input signal Vin 126. The purpose of the trip point is to serve as a dividing line between a high signal (i.e., voltage) and low signal (i.e., voltage). The reference signal Vref 102 is the trip point. As a result, when input signal Vin 126 is above the reference signal Vref 102, the output of the receiver 100 is high. When input signal Vin 126 is below the reference signal Vref 102, the output of the receiver 100 is low. The reference stage biases transistors nFET 124 and pFET 128 to accomplish this task. When input signal Vin 126 is above the reference signal Vref 102, Vint signal 132 is a low signal. When input signal Vin 126 is below the reference signal Vref 102, Vint signal 132 is a high signal.

During operation, if the reference signal Vref 102 is half of the 2.5-volt supply voltage 112, nFET 106 and pFET 108 are turned on and the node 114 is set at a voltage level. The voltage level would also reside on Vset 116. As a result, when Vset 116 is applied to nFET 104 and pFET 110, there is also a voltage level on the node denoted as 109 positioned between pFET 108 and pFET 110. In addition, there is a voltage level on a node denoted as 105 positioned between nFET 104 and nFET 106.

When the reference signal Vref 102 rises relative to where the reference signal Vref 102 was initially set, pFET 108 is turned off a little more and nFET 106 is turned on a little more. In addition, the voltage on Vset 116 drops slightly. When the voltage on Vset 116 drops, pFET 110 turns on a little more and nFET 104 turns off a little more. The voltage at node 109 will rise because the impedance provided by pFET 110 is getting smaller. The impedance produced by nFET 104 is getting larger so the voltage at the node denoted by 105 is going to rise. As a result, the reference stage is used to shift the low_bias voltage 125 and the high_bias voltage 120.

When reference signal Vref 102 is set higher than average, ground (i.e., low_bias voltage 125) and the supply voltage (i.e., high_bias voltage 120) are shifted higher. When reference signal Vref 102 is shifted lower, there is higher impedance at nFET 106 and lower impedance at pFET 108 so Vset 116 is going to go a little higher. As Vset 116 starts to climb, the impedance at pFET 110 increases pushing the node 109 down, and as Vset 116 climbs, the impedance at nFET 104 gets smaller so the voltage on node 105 will fall.

There are problems with the design of the receiver 100. When input signal Vin 126 is a 3.3-volt signal and a 3.3-volt signal is applied to the gate of nFET 124, the source of nFET 124 is tied to the node 105, which is very close to ground. When input signal Vin 126 (i.e., 3.3 volts) is applied to the gate of nFET 124, nFET 124 experiences input signal Vin 126 minus the signal that is very close to ground (i.e., node 105) from its gate to its source. In other words, there is about 3.3 volts from the gate to the source of nFET 124. Since nFET 124 is a 2.5-volt FET, this violates the reliability standards for nFET 124 because nFET 124 should never have more than 2.5 volts across any two terminals. As a result, nFET 124 will experience breakdown.

Thus, there is a need for a method and apparatus for interfacing a low-voltage environment with a high-voltage environment. There is a need for a method and apparatus for receiving a high-voltage signal in an integrated circuit implemented with low-voltage devices. There is a need for a method and apparatus for configuring low-voltage devices so that they can receive and process signals from a high-voltage environment.

SUMMARY OF THE INVENTION

A method and apparatus for receiving a signal from a high-voltage environment and processing the signal in a low-voltage environment is presented. In one embodiment of the present invention, a signal is received from a 3.3-volt environment and processed using low-voltage FETs. Signals from the high-voltage environment are received by a receiver, which conditions the signals for processing in the low-voltage environment.

A receiver comprises an input receiving input signals; a reference circuit generating reference signals; a first inverter coupled to the reference circuit and coupled to the input, the first inverter generating a first inverted signals in response to the reference signals generated by the reference circuit and in response to the input signals received by the input; a gain circuit coupled to the first inverter and generating signals with gain in response to the first inverted signals generated by the first inverter; a clipping circuit coupled to the gain circuit and generating clipped signals in response to the signals with gain generated by the gain circuit; a level shifter coupled to the clipping circuit and generating shifted signals in response to the clipped signal generated by the clipping circuit; a second inverter coupled to the level shifter and generating second inverted signals in response to the shifted signals generated by the level shifter; and an output coupled to the second inverter and communicating output signals in response to the second inverted signals generated by the second inverter.

A system comprises an input receiving input signals; a reference circuit generating reference signals; an inverter coupled to the reference circuit and coupled to the input, the inverter generating inverted signals in response to the reference signals generated by the reference circuit and in response to the input signals received by the input circuit; an amplifying, clipping and inverting circuit coupled to the inverter and generating an amplified, clipped, and inverted signal by amplifying, clipping, level shifting and inverting the inverted signal generated by the inverter; and an output signal coupled to the inverting level shifter and communicating output signals in response to the amplified, clipped, and inverted signal generated by the amplifying, clipping, and inverting circuit.

A method of operating a circuit comprises the steps of generating reference signals; generating inverted signals in response to the reference signals; generating an inverted level shifted signal by baselining, clipping, level shifting and inverting the inverted signals; and generating output signals in response to the inverted level shifted signals.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

An integrated circuit is connected to an external environment through a pad. The external environment may be a motherboard or some other type of electronic system. The pad is the circuitry used to interface between the internal environment and the external environment. The external environment operates at a high-voltage level and the integrated circuit (i.e., internal environment) operates at a low-voltage level (i.e., core voltage), where low and high is relative to each other. It should be appreciated that the internal and external environment may be any to environments and are not restricted to the environments of the chip and the motherboard. For example, any circuits, components or systems may be grouped and identified as the internal environment and any circuits, components or systems may be grouped and identified as the external environment.

A receiver is provided for receiving signals from the high-voltage environment and processing the signals for use in the low-voltage environment. Devices, such as Field Effect Transistors (FET(s)), that operate in the low-voltage environment are implemented to process the signals received from the high-voltage environment. In the method and apparatus of the present invention, signals and voltages will be communicated on different components or circuits in the present invention. Language is used throughout the specification to define the signals or voltages. For example, components or circuits (i.e., a node or FET) may be characterized as "high," "low," "rising" and "falling." This refers to the fact that the signals or voltages on the components are "high," "low," "rising" or "falling." In addition, FETs are characterized as "on" or "off," where on defines a FET that is operating (i.e., conducting) and off defines a FET that is not operating (i.e., conducting).

Figure 2:
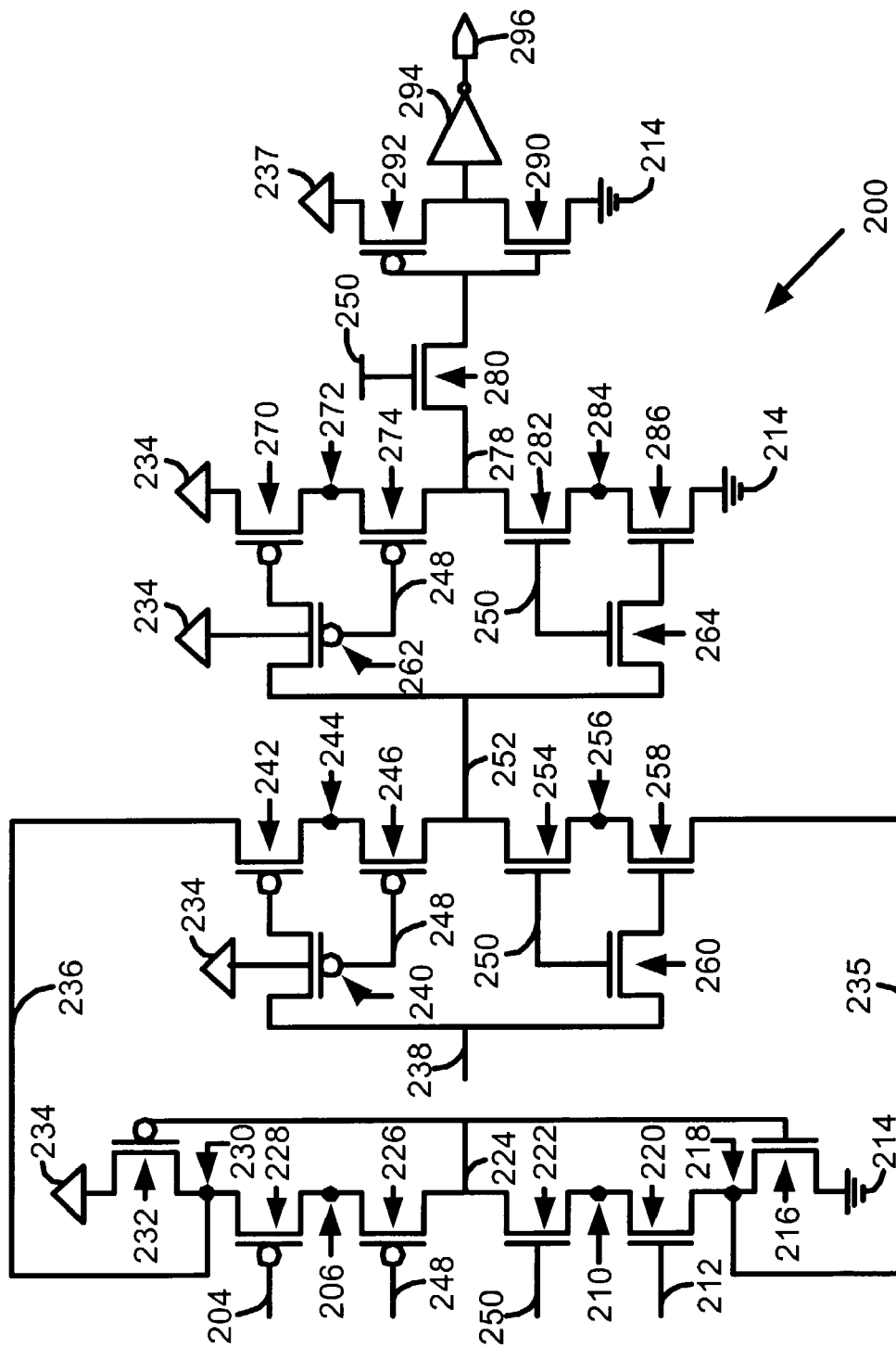
FIG. 2 displays an apparatus implementing an embodiment of the present invention.

An interface circuit is presented in FIG. 2. In one embodiment of the present invention, the interface circuit is a receiver. The receiver 200 of FIG. 2 includes six stages. The first stage is a reference stage. The reference stage receives a number of signal inputs. Reference signals Vref 204 and Vref 212 are shown. A low_bias signal is shown as 248 and a high_bias signal is shown as 250. A number of FETs are connected between the supply voltage 234 and ground 214. The FETs connected between the supply voltage 234 and ground 214 include nFET 216, nFET 220, nFET 222, pFET 226, pFET 228 and pFET 232. A number of nodes are identified in the reference stage. Node 230 between pFET 232 and pFET 228 is identified. Node 206 between pFET 228 and pFET 226 is identified. Node 224 between pFET 226 and nFET 222 is identified. Node 210 between nFET 222 and nFET 220 is identified. Node 218 between nFET 220 and nFET 216 is identified.

A second stage is defined in FIG. 2. The second stage includes four clipping FETs. The four clipping FETs are pFET 240, pFET 246, nFET 254 and nFET 260. In addition, the second stage includes two driving FETs. The two driving FETs are pFET 242 and nFET 258. A number of signals are defined in the second stage. An input signal Vin 238 is defined. A low_bias signal 248 and a high_bias signal 250 are shown. A number of nodes are also defined. Node 244 is positioned between pFET 242 and pFET 246. Node 256 is positioned between nFET 254 and nFET 258. In addition, output node 252 is shown. Lastly, a supply voltage is shown as 234.

A third stage also includes six FETs that operate in a similar manner as the FETs in the second stage. The third stage includes four clipping FETs. The four clipping FETs include pFET 262, pFET 274, nFET 282 and nFET 264. The third stage also includes two driving FETs. The two driving FETs are pFET 270 and nFET 286. A number of signals are defined in the third stage. A low_bias signal 248 and a high_bias signal 250 are shown. A number of nodes are also defined. Node 272 is positioned between pFET 270 and pFET 274. Node 284 is positioned between nFET 282 and nFET 286. In addition, output node 278 is shown. Lastly, a supply voltage is shown as 234.

A fourth stage includes a clipping FET. In one embodiment of the present invention, the clipping FET is nFET 280. The nFET 280 receives a high_bias signal 250.

A fifth stage is connected between ground 214 and a supply voltage 237. In one embodiment of the present invention, the supply voltage 237 is 1.2 volts. The fifth stage includes nFET 290 and pFET 292.

In one embodiment of the present invention, a sixth stage includes an inverter. The inverter 294 is implemented with 1.2-volt FETs. The inverter provides a signal to an output node 296.

The high_bias signal 250 and the low_bias signal 248 are defined in the present invention. In one embodiment of the present invention, the high_bias signal 250 is defined as ¾ of the supply voltage 234. In another embodiment of the present invention, the low_bias signal 248 is defined as ¼ of the supply voltage 234.

Figure 1:
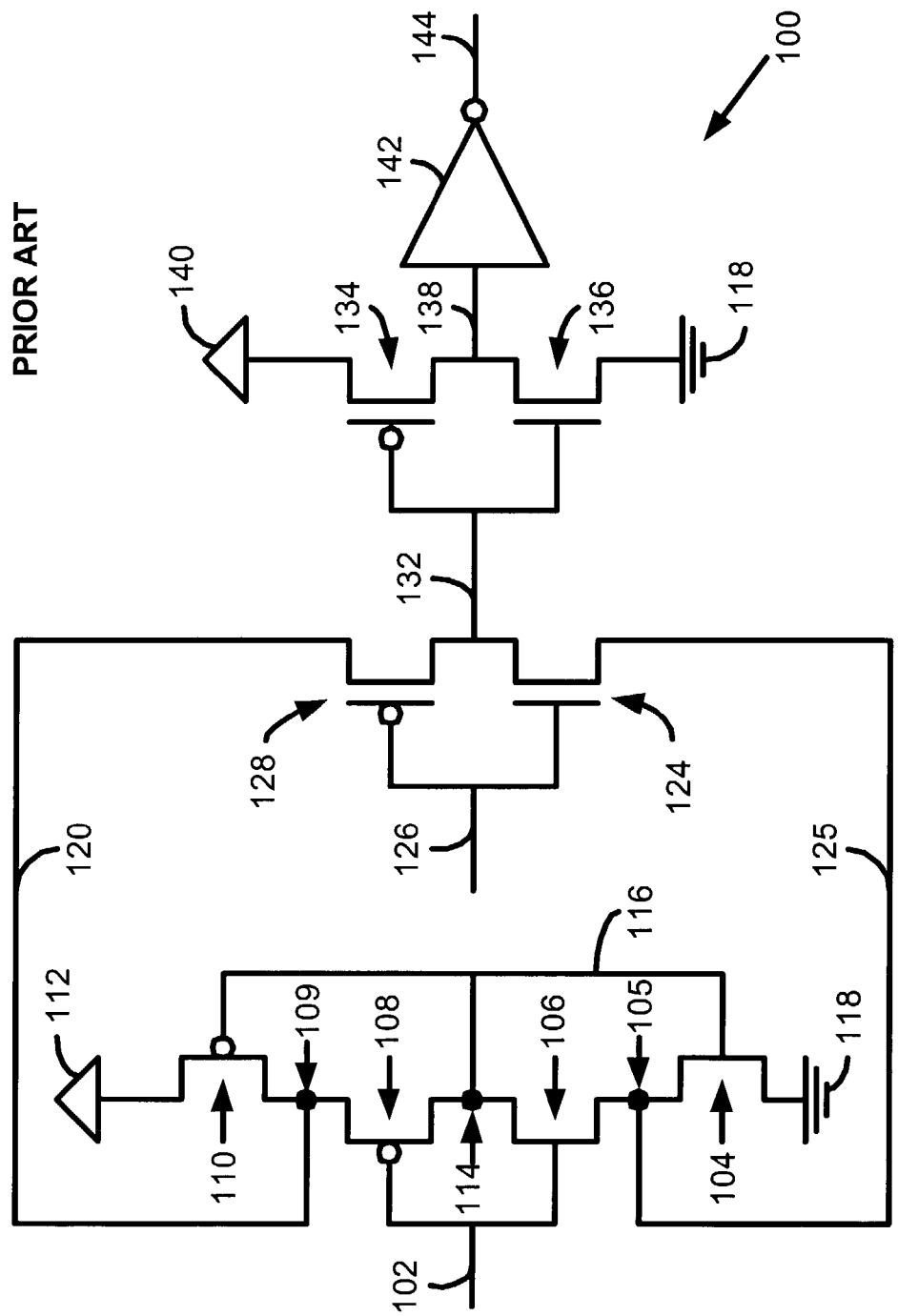
FIG. 1 displays a prior art receiver.

In one embodiment of the present invention, the receiver 200 of FIG. 1 is implemented with 2.5-volt FETs. In addition, the input signal Vin 238 is a high-voltage signal of 3.3 volts. Since the receiver of FIG. 2 is implemented with low-voltage FETs (i.e., 2.5-volt FETs and 1.2-volt FETs), it is advantageous that none of the FETs in the receiver 200 experience a high voltage (i.e., 3.3 volts) across their junctions.

During operations, a signal is received on input signal Vin 238. Clipping FETs are presented to interface with input signal Vin 238. A clipping nFET is shown as 260 and a clipping pFET is shown as 240.

Clipping nFET 260 receives an input signal Vin 238 and a high_bias signal 250. When input signal Vin 238 is logical zero (i.e., low), the clipping nFET 260 allows input signal Vin 238 to pass through to the gate of nFET 258 because high_bias signal 250 is between a high voltage (i.e., 3.3 volts) and ¾ of the high voltage (i.e., 3.3 volts). As a result, nFET 260 is on when input signal Vin 238 is low. As input signal Vin 238 starts to rise, a point is reached where input signal Vin 238 equals the high_bias signal 250 minus a threshold voltage. At the point where input signal Vin 238 equals the high_bias signal 250 minus a threshold voltage, nFET 260 starts to turn off. As input signal Vin 238 starts to move towards the high voltage (i.e., 3.3 volts), nFET 258 is no longer connected to the input signal Vin 238 by a low-impedance path (i.e., nFET 260). As a result, nFET 260 becomes an open circuit between input signal Vin 238 and nFET 258. In one embodiment of the present invention, it is advantageous that the signal on the gate of nFET 258 does not rise above the high_bias signal 250 plus a threshold.

On the opposite side of the second stage, input signal Vin 238 provides a high-voltage (i.e., 3.3 volts) signal to clipping pFET 240. Therefore, clipping pFET 240 receives a high-voltage (i.e., 3.3 volts) input from input signal Vin 238 and a low_bias input as shown at 248. Since pFET 240 receives an input signal Vin 238 at a high voltage (i.e., 3.3 volts) and a low_bias signal 248 on its gate, pFET 240 passes the high voltage (i.e., 3.3 volts) to the pFET 242. As a result, the source of pFET 242 is tied to the high voltage (i.e., 3.3 volts or very close). As a result, the gate voltage (i.e., of pFET 242) is not causing reliability problems as in the case when input signal Vin 238 is high. As input signal Vin 238 drops from a high signal to a low signal, input signal Vin 238 gets down to a point that is equal to the low_bias signal 248 plus a threshold voltage. At the point when input signal Vin 238 drops down to a point that is equal to the low_bias signal 248 plus a threshold, pFET 240 starts to turn off.

The pFET 240 passes input signal Vin 238, when input signal Vin 238 is between 3.3 volts and the low_bias signal 248 plus a threshold. As a result, in one embodiment of the present invention, the signal on the gate of pFET 242 does not go below the low_bias signal 248 plus a threshold. When nFET 258 is turned on, there is a high-impedance path to ground 214 on the nFET side (i.e., nFET 260, nFET 258, nFET 254) and a low-impedance path to ground 214 through pFET 240.

When input signal Vin 238 is driving node 252 high, nFET 258 is turned off and pFET 242 is turned on. When pFET 242 is turned on, node 244 is driven to the high supply voltage (i.e., 234) because the low_bias signal 248 is significantly lower than node 244. As a result, pFET 246 passes the signal on node 244 (i.e., high supply voltage) to node 252.

Once there is a high voltage at node 252, the high_bias signal 250 clips the signal at node 256. As the signal at node 252 transitions from low to high, in one embodiment of the present invention, node 256 is only allowed to raise as high as the high_bias signal 250 minus the threshold on nFET 254. nFET 254 protects nFET 258 from the value on node 252, but only when nFET 258 is turned off. When nFET 258 is turned on, then nFET 254 is transparent because nFET 254 passes zeros from nFET 258 to node 252; as a result of the way nFET 254 is biased on its input gate (i.e., high_bias signal 250).

The second stage is tied to a floating voltage. For example, the second stage is tied to high-voltage reference (i.e., 236) and a low-voltage reference (i.e., 235). The high-voltage reference 236 and the low-voltage reference 235 couple the first stage to the second stage.

A six-FET structure (i.e., nFET 264, pFET 262, pFET 270, pFET 274, nFET 282 and nFET 286) is shown in the third stage. The six-FET structure has four clipping FETs (i.e., nFET 260, pFET 262, pFET 274 and nFET 282). The six-FET structure also includes two driving FETs, pFET 270 and nFET 286. Clipping FETs pFET 262 and nFET 260 protect the gates of pFET 270 and nFET 286, respectively. Clipping FETs pFET 274 and nFET 282 protect the drains of pFET 270 and nFET 286, respectively.

During operations, a signal is received on node 252. Clipping nFET 264 receives an input from node 252 and a high_bias signal 250. When node 252 is logical zero (i.e., low), the clipping nFET 264 allows the signal on node 252 to pass through to the gate of nFET 286 because high_bias signal 250 is ¾ of 3.3 volts. As a result, nFET 264 is on when the signal on node 252 is low. As node 252 starts to rise, a point is reached where node 252 equals the high_bias signal 250 minus a threshold voltage. At the point where node 252 equals the high_bias signal 250 minus a threshold voltage, nFET 264 starts to turn off. As node 252 starts to increase in voltage towards a high voltage (i.e., 3.3 volts), nFET 286 is no longer connected to node 252 by a low-impedance path. In other words, nFET 264 becomes an open circuit between node 252 and nFET 286. Therefore, in one embodiment of the present invention, the signal on the gate of nFET 286 that does not rise above the high_bias signal 250 plus a threshold.

On the opposite side of the third stage, node 252 provides a high-voltage (i.e., 3.3 volts) signal to clipping pFET 262. Therefore, clipping pFET 262 receives a high-voltage (i.e., 3.3 volts) input from node 252 and a low_bias input as shown at 248. Since pFET 262 receives a high voltage (i.e., 3.3 volts) from node 252 and a low_bias signal 248 on its gate, pFET 262 passes the high voltage (i.e., 3.3 volts) to pFET 270. As a result, the source of pFET 270 is tied to a high voltage (i.e., 3.3 volts or very close) so the gate voltage (i.e., pFET 270) is not causing reliability problems (i.e., as when node 252 is high). As the signal on node 252 drops from a high signal to a low signal, the signal on node 252 gets down to a point that is equal to the low_bias signal 248 plus a threshold voltage. When the signal on node 252 drops down to a point that is equal to low_bias signal 248 plus a threshold, pFET 262 starts to turn off.

The pFET 262 passes the signal on node 252 when the signal is between a high voltage (i.e., 3.3 volts) and low_bias signal 248 plus a threshold. In one embodiment of the present invention, it is advantageous that the signal on the gate of pFET 270 does not go below the low_bias signal 248 plus a threshold. When nFET 286 is turned off, there is a high-impedance path to ground 214 on the nFET side of the circuit (i.e., nFET 282, nFET 286) and a low-impedance path to supply voltage 234 at pFET 274.

If a signal on node 252 is driving node 278 high, nFET 286 is turned off and pFET 270 is turned on. When pFET 270 is turned on, the node 272 is driven to the high supply voltage (i.e., 234) and because the low_bias signal 248 is significantly lower than node 272, pFET 274 passes the signal on node 272 (i.e., high supply voltage) to node 278.

Once there is a high voltage at node 278, the high_bias signal 250 clips the signal at node 284. As the signal at node 278 transitions from low to high, node 284 is allowed to raise as high as the high_bias signal 250 minus the threshold on nFET 282. In one embodiment of the present invention, the purpose of nFET 282 is to protect nFET 286 from the signals on node 278, but only when nFET 286 is turned off. When nFET 286 is turned on, then nFET 282 is transparent because nFET 282 passes zeros from nFET 286 to node 278 (i.e., as a result of the way, nFET 282 is biased on its input gate).

Node 278 provides input to clipping nFET 280. In one embodiment of the present invention, nFET 280 is 2.5 volts. In addition, nFET 280 receives a high_bias signal 250. Node 278 transitions between 3.3 volts and zero volts. Therefore, the signal on node 278 is clipped by nFET 280 so that in one embodiment of the present invention, the output of nFET 280 does not go above 2.5 volts. nFET 280 passes zeros through until node 278 starts to increase and is equal to high_bias signal 250 minus a threshold. At the point when nFET 280 is equal to the high_bias signal 250 minus a threshold, nFET 280 shuts off and does not pass a signal to the next stage.

The fifth stage includes 2.5-volt FETs that are tied to a 1.2-volt supply voltage 237. The 2.5-volt FETs are shown as nFET 290 and pFET 292. When the input to the fifth stage (nFET 290, pFET 292) is low, nFET 290 is turned off, pFET 292 is turned on, and 1.2 volts passes through the fifth stage. When the input to the fifth stage transitions to 2.5 volts, nFET 290 turns on, pFET 292 turns off, and zero volts is passed through the fifth stage. As a result, nFET 290 and pFET 292 level shift downward since they are tied to a 1.2-volt supply voltage 237. The fifth stage feeds an inverter 294. The inverter 294 is implemented with 1.2-volt FETs. The inverter 294 inverts the signal from the fifth stage and supplies a 1.2-volt output to node 296.

For the purpose of demonstrating the operation of the receiver 200 of FIG. 2, assume reference signals Vref 204 and Vref 212 are midway between a high voltage (i.e., 3.3 volts) and the ground 214. As reference signals Vref (i.e., 204, 212) start to raise, there is a higher-impedance path at pFET 228. A higher-impedance path at pFET 228 causes node 224 to lower. In addition, as reference signals Vref (i.e., 204, 212) start to raise, there is a lower-impedance path at nFET 220. The lower-impedance path on nFET 220 also helps to pull node 224 lower. Therefore, as reference signals Vref (i.e., 204, 212) go up, node 224 goes down.

Node 230 is positioned between pFET 232 and pFET 228. Node 218 is positioned between nFET 216 and nFET 220. As node 224 starts to lower, pFET 232 becomes a lower-impedance path and node 230 starts to increase. Also, as node 224 lowers, nFET 216 becomes a higher-impedance path and node 218 starts to increase.

In one embodiment of the present invention, clipping FETs shown as nFET 222 and pFET 226 are used for protection purposes. nFET 222 and pFET 226 protect nFET 220 and pFET 228 from over-voltage effects. For example, if node 224 is high, nFET 222 would protect nFET 220 from a high voltage of 3.3 volts provided by the supply voltage 234. As node 224 is transitioning from low to high when the signal on node 224 is low, nFET 222 passes low signals until node 224 gets to a high_bias signal 250 minus a threshold voltage. When the signal on node 224 gets to the value of the high_bias signal 250 minus a threshold voltage, nFET 222 becomes high impendence and does not pass any voltages above the value of the high_bias signal 250 minus a threshold. Likewise, in one embodiment of the present invention, it is advantageous that pFET 226 does not pass voltage values lower than a low_bias signal 248 plus a threshold voltage, on node 206.

Figure 3:
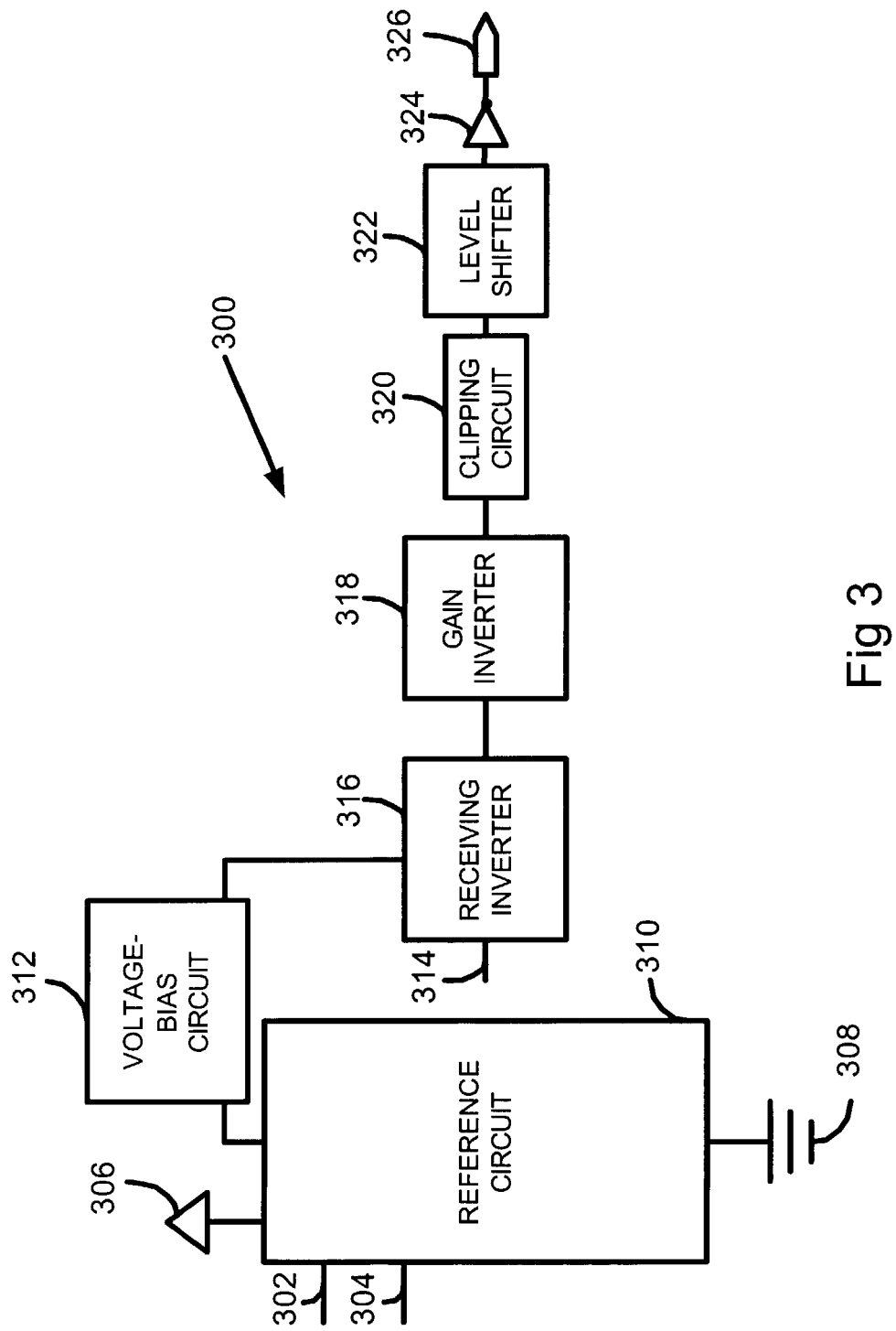
FIG. 3 displays a block diagram embodiment of the present invention.

FIG. 3 displays a receiver 300. The receiver 300 is a block diagram of the receiver 200 shown in FIG. 2. It should be appreciated that, while the circuit of FIG. 2 shows one implementation of the receiver 300, other implementations are within the scope of the present invention. For example, implementations that utilize different circuit configurations and elements are within the scope of the present invention.

In FIG. 3, the reference circuit 310 may be implemented with the first stage of FIG. 2, which includes nFET 216, nFET 220, nFET 222, pFET 226, pFET 228 and pFET 232. The receiving inverter 316 may be implemented by the second stage of the receiver 200. As a result, in one embodiment, the receiving inverter 316 may be implemented with pFET 240, pFET 242, pFET 246, nFET 254, nFET 258 and nFET 260. The gain inverter 318 may be implemented with the third stage of the receiver 200. Consequently, gain inverter 318 may be implemented by pFET 262, pFET 270, pFET 274, nFET 282, nFET 286 and nFET 264. The clipping circuit 320 may be implemented with nFET 280. The level shifter 322 may be implemented with nFET 290 and pFET 292. Inverter 324 may be implemented with inverter 294. Output node 326 may be implemented with output node 296.

During operation, an input signal Vin 314 is received and processed by the receiving inverter 316. In one embodiment, input signal Vin 314 is 3.3 volts. The receiving inverter 316 inverts input signal Vin 314. The receiving inverter 316 processes the signal and communicates the signal to the gain inverter 318. The gain inverter 318 adds gain to the signal. The gain inverter 318 conditions the signal and provides a baseline for the signal. For example, gain inverter 318 processes the inverted signal produced by receiving inverter 316 so that the inverted signal has a full baseline-to-baseline (i.e., rail-to-rail) transition, where a baseline-to-baseline transition is a transition from one rail to the other rail (i.e., ground to supply voltage). The gain inverter 318 produces a signal with gain (i.e., 3.3 volts) that is received by the clipping circuit 320. The clipping circuit 320 clips the signal with gain and generates a clipped signal. In one embodiment of the present invention, the clipped signal is clipped so that the signal does not exceed 2.5 volts. A level shifter 322 receives the clipped signal. A supply voltage powers the level shifter 322. For example, in one embodiment of the present invention, the supply voltage is 1.2 volts. The level shifter 322 produces a shifted signal. For example, in one embodiment of the present invention, the level shifter 322 generates a shifted signal that is shifted to 1.2 volts. An inverter 324 receives the shifted signal. The inverter 324 produces a shifted and inverted signal at the output node 326. A supply voltage of 1.2 volts powers the inverter 324.

The receiving inverter 316 generates a signal that is processed by a voltage-bias circuit 312. The voltage-bias circuit 312 generates a high_voltage reference signal and a low_voltage reference signal. The high_voltage reference signal and the low_voltage reference signal are input into the reference circuit 310. The reference circuit 310 also receives a reference signal 302 and a bias signal 304. The bias signal 304 is either a high_bias signal or a low_bias signal. In one embodiment of the present invention, the high_bias signal 304 is ¾ of the supply voltage 306. In another embodiment of the present invention, the low_bias signal 304 is ¼ of the supply voltage 306.

In one embodiment of the present invention, the high_voltage reference signal may be implemented with high_voltage reference 236. Low-voltage reference signal may be implemented with low_voltage reference 235. The high_bias signal may be implemented with high_bias signal 250 and the low_bias signal may be implemented with low_bias signal 248. The reference signal 302 may be implemented with Vref 204 and Vref 212.

The reference circuit 310 provides a floating reference for the level shifter 300. The reference signal 302 works in conjunction with the input signal Vin 314. When the input signal Vin 314 is above the reference signal 302, a high voltage is produced at output node 326. When the input signal Vin 314 is below the reference signal 302, a low voltage is produced at output node 326.

Figure 4:
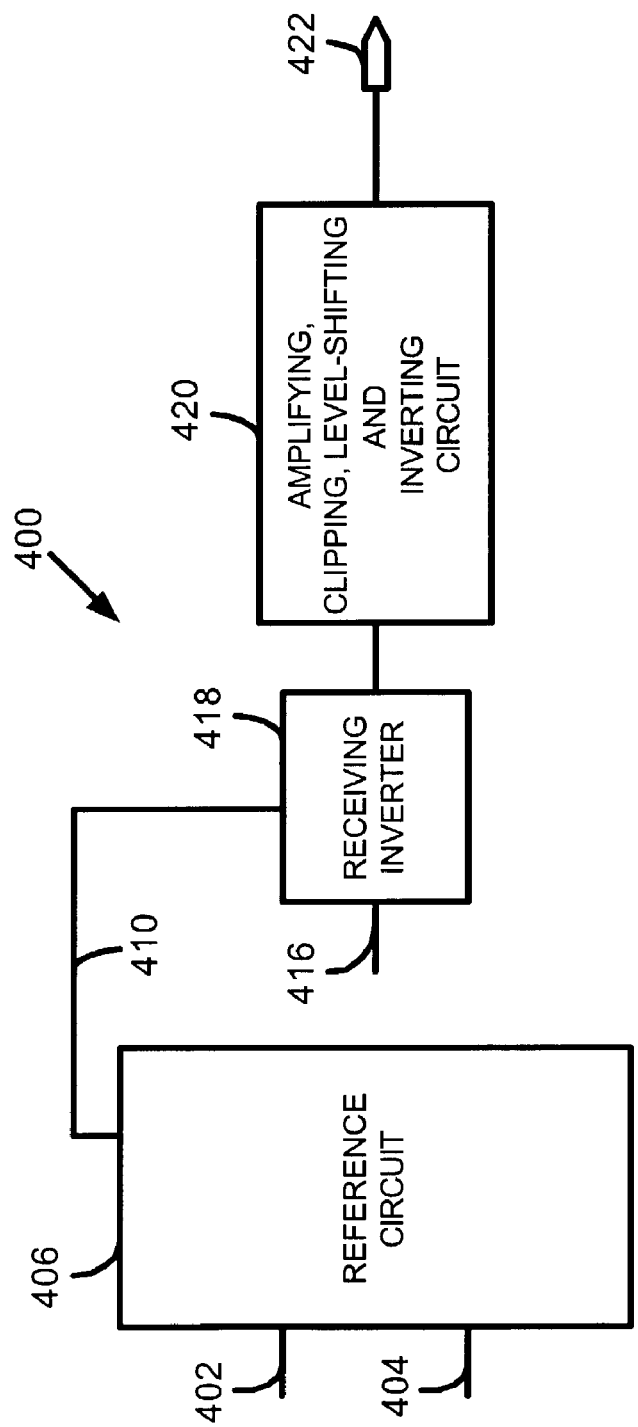
FIG. 4 displays an alternate embodiment of the present invention.

FIG. 4 displays an alternate embodiment of a receiver 400. The receiver 400 receives an input signal 416 in a receiving inverter 418. The receiving inverter 418 provides an inverted signal to an amplifying, clipping and inverting circuit 420. The amplifying, clipping, level-shifting and inverting circuit 420 produces an amplified, clipped, level-shifted and inverted signal to output node 422. The amplifying, clipping, level-shifting and inverting circuit 420 performs the functions of the gain inverter 318, the clipping circuit 320, the level shifter 322, and the inverter 324 of FIG. 3. Therefore, the amplifying, clipping, level-shifting and inverting circuit 420 adds gain to a signal received from receiving inverter 316, clips the signal, level shifts the signal, and inverts the signal. A voltage_reference signal (i.e., floating voltage signal) is generated on 410 by the receiving inverter 418. The voltage_reference signal 410 includes a high_voltage reference signal and a low_voltage reference signal. The voltage_reference signal 410 is input into a reference circuit 406. A reference signal 402 and a bias signal 404 are also input into the reference circuit 406. The voltage_reference signal 410 may be implemented with voltage-bias circuit 312. The reference signal 402 may be implemented with the reference signal 302. The bias signal 404 may be implemented with the bias signal 304.

The reference circuit 406 provides a floating reference for the receiver 400. The reference signal 402 works in conjunction with the input signal 416, the reference signal 402 and the receiving inverter 418. When the input signal 416 is above the reference signal 402, a high voltage is produced at output node 422. When the input signal 416 is below the reference signal 402, a low voltage is produced at output node 422.

Thus, the present invention has been described herein with reference to a particular embodiment for a particular application. Those having ordinary skills in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A system for receiving a high-voltage signal in a circuit implemented with low-voltage devices, the system comprising:
   a reference circuit generating reference signals;
   a first inverter, receiving the high-voltage signal, coupled to the reference circuit and generating first inverted high-voltage signals in response to the received high-voltage signal and the reference signals generated by the reference circuit;
   a gain inverter coupled to the first inverter and generating a high-voltage signal with gain in response to the first inverted high-voltage signals generated by the first inverter;
   a clipping circuit coupled to the gain inverter and generating clipped signals in response to the high-voltage signal with gain generated by the gain inverter;
   a level shifter coupled to the clipping circuit and generating shifted low-voltage signals in response to the high-voltage clipped signal generated by the clipping circuit;
   a second inverter coupled to the level shifter and generating second inverted signals in response to the shifted low-voltage signals generated by the level shifter; and
   an output coupled to the second inverter and communicating output signals in response to the second inverted signals generated by the second inverter;
   wherein one or more of the reference circuit, the first inverter, the gain inverter, the clipping circuit, the level shifter, and the second inverter comprises one or more low-voltage devices, the one or more low-voltage devices respectively rated at corresponding one or more maximum voltages, the low-voltage devices configured to allow no more than the corresponding maximum voltage across any two respective terminals of any of the respective low-voltage devices.

2. A system as set forth in claim 1, wherein the reference signals are a high voltage signal.

3. A system as set forth in claim 1, wherein the reference signals are low voltage signals.

4. A system as set forth in claim 1, the system further comprising, a supply voltage coupled to the reference circuit and a high bias input coupled to the reference circuit the high bias input generating high bias signals that are ¾ of the supply voltage and the reference circuit generating the reference signals in response to the high bias signals.

5. A system as set forth in claim 1, the system further comprising, a supply voltage coupled to the reference circuit and a low bias input coupled to the reference circuit the low bias input generating low bias signals that are ¼ of the supply voltage and the reference circuit generating the reference signals in response to the low bias signals.

6. A method of operating a system for receiving high-voltage signals in a circuit implemented with low-voltage devices, the method comprising the steps of:
generating reference signals;
receiving the high-voltage signals;
generating first inverted high-voltage signals in response to the high-voltage signals and the reference signals;
generating high-voltage signals with gain in response to the first inverted high-voltage signals;
generating clipped signals in response to the high-voltage signals with gain;
generating shifted low-voltage signals in response to the clipped high-voltage signal;
generating second inverted signals in response to the shifted low-voltage signals; and
generating low-voltage output signals in response to the second inverted signals;
wherein one or more of the inverted high-voltage signals and the high-voltage signals with gain are generated using one or more low-voltage devices, the one or more low-voltage devices respectively rated at corresponding one or more maximum voltages, the low-voltage devices configured to allow no more than the corresponding maximum voltage across any two respective terminals of any of the respective low-voltage devices.

7. A system for receiving high-voltage signals in a circuit implemented with low-voltage devices, the system comprising:
means for generating reference signals;
means for receiving high-voltage signals;
means for generating first inverted high-voltage signals in response to the high-voltage signals and the reference signals;
means for generating high-voltage signals with gain in response to the first inverted high-voltage signals;
means for generating clipped signals in response to the high-voltage signals with gain;
means for generating shifted low-voltage signals in response to the clipped high-voltage signal;
means for generating second inverted signals in response to the shifted low-voltage signals; and
means for generating low-voltage output signals in response to the second inverted signals;
wherein one or more of the inverted high-voltage signals and the high-voltage signals with gain are generated using one or more low-voltage devices, the one or more low-voltage devices respectively rated at corresponding one or more maximum voltages, the low-voltage devices configured to allow no more than the corresponding maximum voltage across any two respective terminals of any of the respective low-voltage devices.

8. A system comprising:
an input receiving high-voltage input signals;
a reference circuit generating reference signals;
an inverter coupled to the reference circuit and coupled to the input, the inverter generating inverted high-voltage signals in response to the reference signals generated by the reference circuit and in response to the high-voltage input signals received by the input circuit;
an amplifying clipping and inverting circuit coupled to the inverter and generating an amplified, clipped, and inverted signal by amplifying, clipping, level shifting and inverting the inverted high-voltage signal generated by the inverter; and
low-voltage output signal coupled to the inverting level shifter and communicating output signals in response to the amplified, clipped, and inverted signal generated by the amplifying, clipping, and inverting circuit;
wherein one or more of the reference circuit, the inverter, and the amplifying clipping and inverting circuit comprises one or more low-voltage devices, the one or more low-voltage devices respectively rated at corresponding one or more maximum voltages, the low-voltage devices configured to allow no more than the corresponding maximum voltage across any two respective terminals of any of the respective low-voltage devices.

9. A method of operating a system comprising the steps of:
generating reference signals;
receiving high-voltage input signals;
generating inverted high-voltage signals in response to the received high-voltage input signals and the reference signals;
generating an inverted level shifted signal by baselining, clipping, level shifting and inverting the inverted high-voltage signals; and
generating low-voltage output signals in response to the inverted level-shifted signals;
wherein one or more of the inverted high-voltage signals and the inverted level shifted signal are generated using one or more low-voltage devices, the one or more low-voltage devices respectively rated at corresponding one or more maximum voltages, the low-voltage devices configured to allow no more than the corresponding maximum voltage across any two respective terminals of any of the respective low-voltage devices.

10. A system comprising:
means for generating reference signals;
receiving high-voltage input signals;
means for generating inverted high-voltage signals in response to the received high-voltage input signals and the reference signals;
means for generating an inverted level shifted signal by baselining, clipping, level shifting and inverting the inverted high-voltage signals; and
means for generating low-voltage output signals in response to the inverted level-shifted signals;
wherein one or more of the inverted high-voltage signals and the inverted level shifted signal are generated using one or more low-voltage devices, the one or more low-voltage devices respectively rated at corresponding one or more maximum voltages, the low-voltage devices configured to allow no more than the corresponding maximum voltage across any two respective terminals of any of the respective low-voltage devices.

* * * * *